(12) United States Patent
Maruhashi

(10) Patent No.: US 6,239,497 B1
(45) Date of Patent: May 29, 2001

(54) SUBSTRATE FOR PACKING SEMICONDUCTOR DEVICE AND METHOD FOR PACKING A SEMICONDUCTOR DEVICE IN THE SUBSTRATE

(75) Inventor: Kenichi Maruhashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/120,467

(22) Filed: Jul. 23, 1998

(30) Foreign Application Priority Data

Jul. 23, 1997 (JP) .................................................. 9-197129

(51) Int. Cl.⁷ .............................. H01L 23/48; H01L 21/44
(52) U.S. Cl. ......................... 257/778; 257/723; 438/107; 438/108
(58) Field of Search ................................ 438/14, 15, 106, 438/108, 107, 975, 924, 984; 257/678, 730, 723, 734, 786, 778

(56) References Cited

U.S. PATENT DOCUMENTS 5,616,520 * 4/1997 Nishiuma et al. .................... 438/125
5,729,038 * 3/1998 Young et al. ......................... 257/460
6,046,077 * 4/2000 Baba ..................................... 438/127
6,057,597 * 5/2000 Farnworth et al. ................... 257/710

FOREIGN PATENT DOCUMENTS

| 58-109254 | 7/1983 | (JP) . |
| 4-334049 | 11/1992 | (JP) . |
| 5-63136 | 3/1993 | (JP) . |
| 6-244304 | 9/1994 | (JP) . |

* cited by examiner

Primary Examiner—Kevin M. Picardat
(74) Attorney, Agent, or Firm—McGinn & Gibb, PLLC

(57) ABSTRACT

In a multilayer substrate wherein a first ceramic layer, a wiring layer and a second ceramic layer are provided, a portion of the second ceramic layer is removed to expose the wiring layer, thereby forming a cavity inside which a semiconductor device is to be inserted. On the wiring layer inside the cavity, a bump to which an electrode pad on the surface of the semiconductor device is connected is formed. The size of the cavity is larger by a predetermined size (t) than the size of the external form of the semiconductor device, and the size (t) is smaller than the size (s) of the electrode pad formed on the semiconductor device. This makes it possible to shorten working time and restrain the deterioration of various properties even in a semiconductor device having low heart-resistance.

12 Claims, 6 Drawing Sheets

SUBSTRATE FOR PACKING SEMICONDUCTOR DEVICE AND METHOD FOR PACKING A SEMICONDUCTOR DEVICE IN THE SUBSTRATE

BACKGROUND OF THE INVENTION

1. Field of the Invention

The present invention relates to a substrate for packing a semiconductor device, especially a high frequency semiconductor device, and a method for packing the semiconductor device in the packing substrate.

2. Related Arts

FIG. 1 illustrates a conventional semiconductor device packing substrate for packing a high frequency semiconductor device which works at a microwave or millimeter wave band. A first ceramic layer 101, a metal layer 102, a second ceramic layer 103, a wiring layer 104, and a third ceramic layer 105 are in turn laminated or provided to construct a multilayer ceramic substrate. A portion of the second ceramic layer 103, the wiring layer 104 and the third ceramic layer 105 is selectively removed off to form a cavity 106. A semiconductor device 107 on which an electrode pad 108 is provided is mounted on the metal layer 102 exposed by forming the cavity 106. In this case, the wiring layer 104 is used as an inner layer wiring, and is connected to the electrode pad 108 through a bonding wire 109. The length of the bonding wire 109 is several hundred μm, and consequently inductance owing to the bonding wire increases to make transmission of signals difficult at an operation frequency within, especially, a millimeter wave band or higher frequency band. In order to ensure that the cavity has an area into which a semiconductor device is inserted, it is necessary to make the size of the cavity larger than that of the semiconductor device. Therefore, the position where the semiconductor device is packed inside the cavity 106 is varied and the length of the bonding wire 109 is also varied. As a result, various properties of the produced semiconductor devices are also varied, resulting in a drop in the yield rate thereof.

As an example of device in the prior art for that overcomes this problem, FIG. 2 illustrates a cross section of the main portion of a hybrid integrated circuit device disclosed in Japanese Patent Application Laid-Open No. 5-63136. In this case, a wiring layer 203 is disposed inside a cavity 202 formed in a multilayer substrate 201, and bump 204 is formed on the wiring layer 203. With the bump 204, the wiring layer 203 is electrically connected to an electrode pad 206 of a semiconductor device 205. Thus, the semiconductor device 205 is electrically connected to the wiring layer 203 with the small inductor element. This prior art example shows the structure of the hybrid integrated circuit device, but does not make any specific packing process clear.

The process for packing a semiconductor device by the aforementioned bump connection includes a process using the contractile force of a resin or the like for bonding, a thermo compression bonding process using compression accompanied with heating for bonding, and a hot melt process of thermally melting bumps for bonding. In all of these processes, however, an expensive position-aligning apparatus is necessary for precisely arranging semiconductor devices in the positions where the semiconductor devices are to be packed.

In the thermo compression bonding or hot melting process, position-aligning must be carried out with heating, and consequently, a large-scale apparatus becomes necessary. When plural elements are packed inside plural cavities in the same substrate, the elements must be packed one by one by using the position-aligning apparatus. For this reason, the packing-work takes a long time, and for semiconductor devices having low heat-resistance, various properties are deteriorated.

The process using the contractile force of a resin or the like has another problem in that a high frequency property is deteriorated because of the fact that dielectric loss and parasite capacitance are enlarged by the resin at an operation frequency within, especially, a millimeter wave band or higher frequency band.

SUMMARY OF THE INVENTION

An object of the present invention is to provide a substrate for packing a semiconductor device for which an expensive and highly precise position-aligning apparatus is not necessary when a wiring layer disposed inside a cavity formed in the substrate is connected to a semiconductor device by means of a bump formed on the wiring layer, and in which any resin which degrades a high frequency property is not used and a plurality of the semiconductor devices can be packed at the same time.

Another object of the invention is to provide a method for packing a semiconductor device in this semiconductor device packing substrate.

Still another object of the invention is to provide a semiconductor device packing substrate that can shorten working time and restrain deterioration of various properties even in a semiconductor device having low heat-resistance.

The semiconductor device packing substrate is a substrate in which a semiconductor device having an electrode pad is packed. This packing substrate comprises a multilayer substrate having a wiring layer for transmitting at least high frequency signal, and a bump for connecting the wiring layer to the semiconductor device. In the substrate, a cavity inside which the semiconductor device is embedded is disposed. The bump is disposed inside the cavity. The size of the cavity is larger by a predetermined size than the size of the semiconductor device, and the upper limit of the predetermined size is the size of the electrode pad disposed on the semiconductor device.

When in this invention the semiconductor device is packed inside the cavity in the semiconductor device packing substrate which is larger by the predetermined size than the semiconductor device so that the cavity can receive the semiconductor device, the side wall of the cavity functions as a guide. Since the upper limit of the predetermined size is the size of the electrode pad disposed on the semiconductor device, the semiconductor device is put on the bump, with a tolerance within the size of the electrode pad. Subsequently, the bump is melted by heating the packing substrate, so that the semiconductor device can move to the right position (e.g., where the device is to be packed by surface tension of the melted bump) even if the device is out of position beforehand. As a result, the semiconductor device is precisely packed in the right position. After heating, the electrode pad formed on the semiconductor device is connected to the wiring layer through the bump.

The semiconductor device can be put at room temperature without use of any especially expensive and precise position-aligning apparatus. Even if a plurality of the cavities inside which semiconductor devices are embedded are formed in the single multilayer substrate, it is unnecessary for the semiconductor devices to be mounted one by one using the position-aligning apparatus as in the prior art, and the plural semiconductor devices can be packed at a time by heating the substrate which is in the state that these elements are packed inside the respective cavities. Therefore, it is possible to shorten working time for packing and restrain deterioration of various properties even in semiconductor devices having low heat-resistance.

Furthermore, the present invention eliminates the problem that high frequency wave property is deteriorated as occurs in the packing process using contractile force of a resin or the like, because the present invention relates to a process wherein the bump is melted by heating to connect the wiring layer to the electrode pad on the semiconductor device.

DESCRIPTION OF THE PREFERRED EMBODIMENTS

Preferred embodiments will be described below, referring to the attached drawings.

(First Embodiment)

Figure 1:
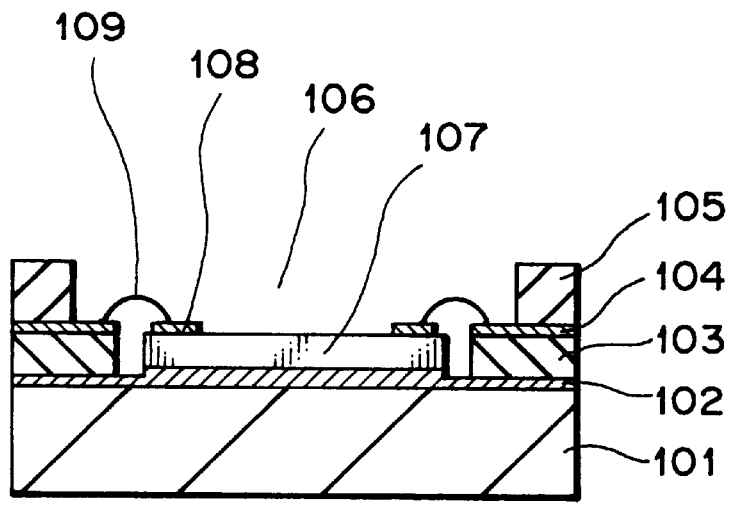
FIG. 1 is a cross-sectional view showing a conventional photosemiconductor device packing substrate.
Figure 2:
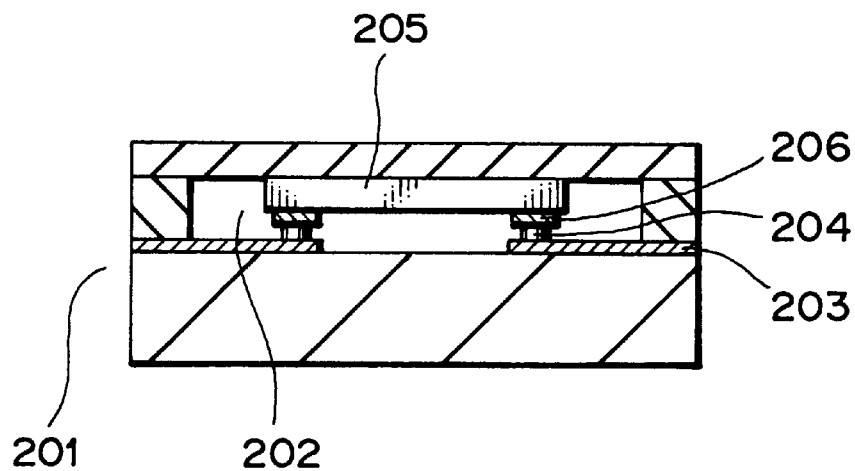
FIG. 2 is a cross-sectional view showing the main portion of a conventional hybrid integrated circuit device disclosed in Japanese Patent Application Laid-Open No. 5-63136.
Figure 3A:
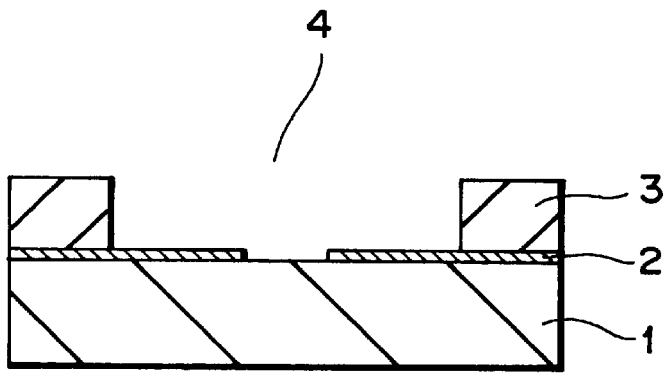
FIGS. 3A to 3C are cross-sectional views showing a process for manufacturing a semiconductor device packing substrate according to the first embodiment of the invention.
Figure 3B:
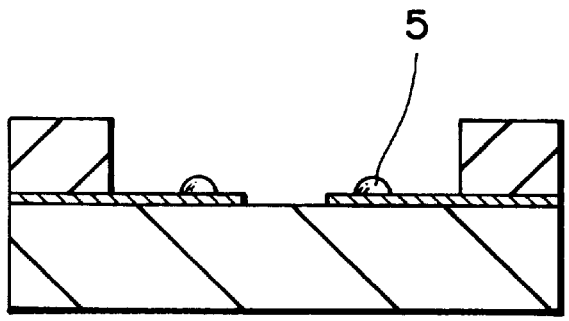
Figure 3C:
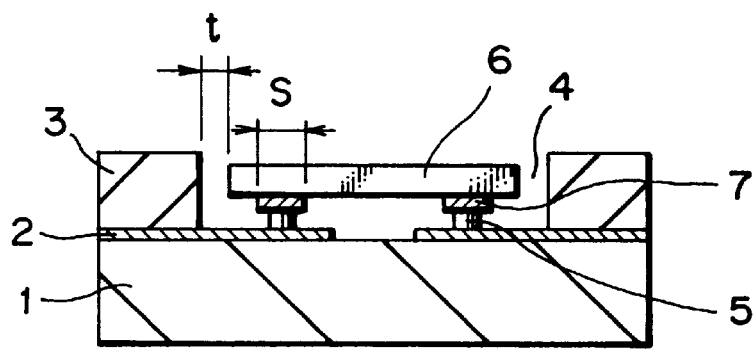

FIGS. 3A to 3C are cross-sectional views showing a process for manufacturing a semiconductor device packing substrate according to the first embodiment of the invention.

As shown in FIG. 3A, the semiconductor device packing substrate according to the present embodiment comprises a multilayer substrate wherein a first ceramic layer 1, a wiring layer 2 and a second ceramic layer 3 are provided. In this multilayer substrate, a portion of the second ceramic layer 3 is removed so that the wiring layer 2 is exposed. Thus, a cavity 4 inside which a semiconductor device is to be inserted is formed.

As shown in FIG. 3B, a bump 5 is formed on each of the wiring layer 2 inside the cavity 4. The bump 5 is to be connected to an electrode pad on the surface of the semiconductor device. The bump 5 is melted at a specific temperature. A wiring pattern, as the wiring layer 2, is pulled out from the cavity 4 to the side face of the substrate having such a multilayer as above.

FIG. 3C is a cross section of the semiconductor device packing substrate on which a semiconductor device 6 is packed. As shown in FIG. 3C, the characteristic of the semiconductor device packing substrate in this embodiment is that the size of the cavity 4 is larger by a predetermined size (t) than the size of the external form of the semiconductor device 6, and the size (t) is smaller than the size (s) of the electrode pad 7 formed on the semiconductor device 6 (t<s).

The following will describe the process for producing the semiconductor device packing substrate in this embodiment. As shown in FIG. 3A, provided are the first ceramic layer 1 made of a glass ceramic, the wiring layer 2 made of copper and the second ceramic layer 3 made of a glass ceramic. A portion of the second ceramic layer 3 is selectively removed off to form the cavity 4 which is a space inside which the semiconductor device should be embedded.

On the contrary, the second ceramic layer 3 wherein a portion is beforehand removed off may be provided on the wiring layer 2 to form the cavity 4.

Subsequently, the multilayer is sintered so that the first ceramic layer 1, the wiring layer 2 and the second ceramic layer 3 are united. After sintering, the bumps 5 are formed on the wiring layer 2 by using, for example, AuSn or the like. The size of the cavity 4 is larger by the predetermined size (t) than that of the external form of the semiconductor device 6 to be packed, and the size (t) is smaller than that of the electrode pad 7 formed on the semiconductor device 6. The electrode pad 7 formed on the semiconductor device 6 generally has a size of 30 to 300 $\mu$m; therefore, the upper limit of the size (t) is 300 $\mu$m or less.

Figure 4A:
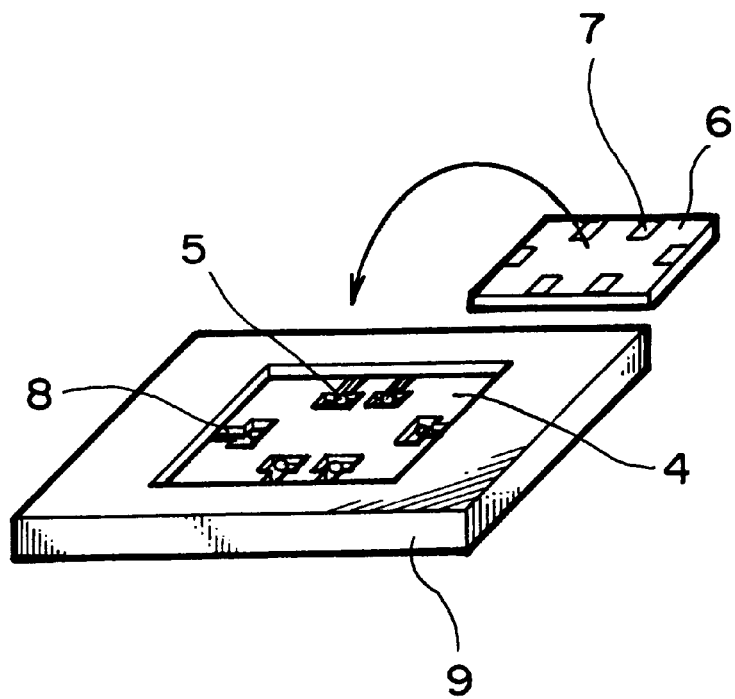
FIGS. 4A and 4B are perspective views showing a process for packing a semiconductor device in the semiconductor device packing substrate according to the first embodiment of the invention.
Figure 4B:
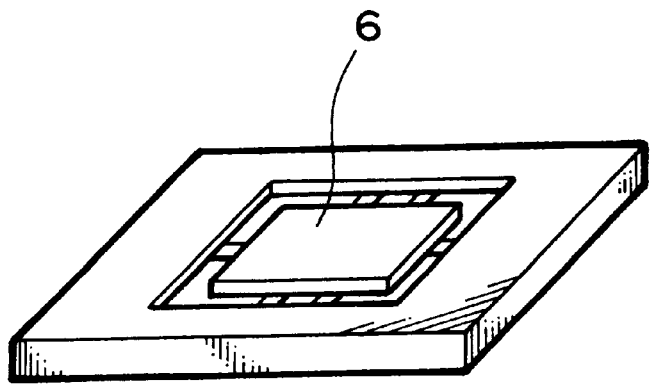

The following will further describe a process for packing a semiconductor device in this semiconductor device packing substrate. FIGS. 4A and 4B are perspective views showing a process for mounting a semiconductor device on the semiconductor device packing substrate. A semiconductor device 6 is inserted inside the cavity 4 in the semiconductor device packing substrate 9 so that the cavity 4 can receive the electrode pad 7 formed on the semiconductor device 6 such as a semiconductor integrated circuit having, for example, a GaAs substrate. At this time, the side wall of the cavity 4 functions as a guide, so that the semiconductor device 6 is put in a packing position, with a tolerance within the size (s) of the electrode pad on the basis of the aforementioned requirement of t<s. This step can be carried out at room temperature without using highly precise position-aligning apparatus. Thus, contact of the electrode pad 7 with the bump 5 is realized. The bumps 5 are made from, for example, AuSn by a punching process. The bump 5 is melted by putting the semiconductor device packing substrate 9 on a plate (not illustrated) heated to, for example, 300° C. If necessary, vibration or a sound wave may be applied thereto to promote the melting of the bump 5. The semiconductor device 6 moves to a right packing position by surface tension of the melted bump 5, so that it can be arranged at the right position precisely. After heating, the electrode pad 7 formed on the semiconductor device 6 and the wiring 8 are connected to each other through the bump 5.

(Second embodiment)

Figure 5A:
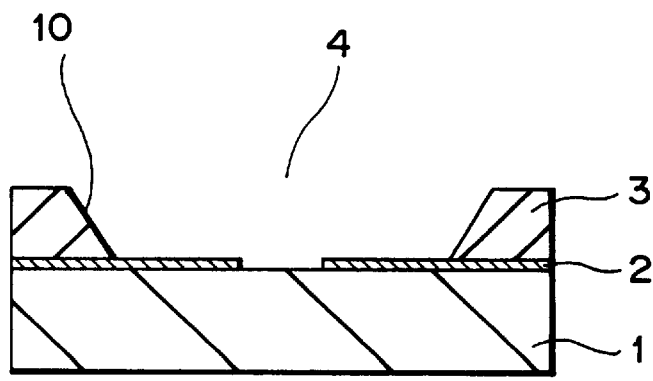
FIGS. 5A to 5C are cross-sectional views showing a process for manufacturing a semiconductor device packing substrate according to the second embodiment of the invention.
Figure 5B:
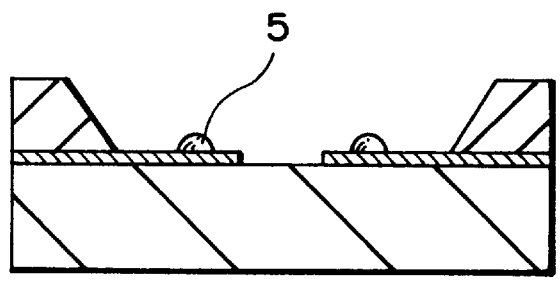
Figure 5C:
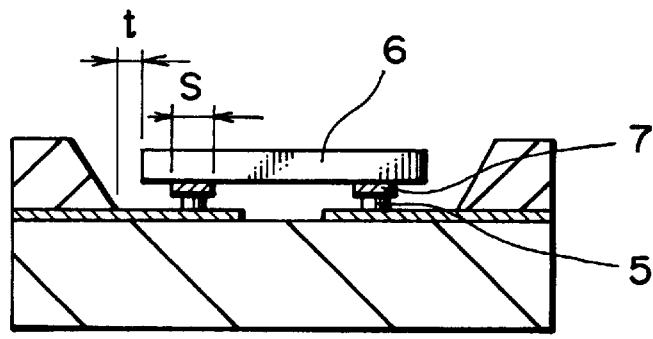

FIGS. 5A to 5C are cross-sectional views showing a process for manufacturing a semiconductor device packing substrate according to the second embodiment of the invention. In this figure, the same numbers are attached to the same elements as in the first embodiment.

As shown in FIG. 5C, in the semiconductor device packing substrate of this embodiment, the size of the bottom portion of the cavity 4 is larger by a predetermined size (t) than that of the external form of the semiconductor device 6, and the size (t) is smaller than the size (s) of the electrode pad 7 formed on the semiconductor device 6 (t>s). The electrode pad formed on the semiconductor device generally has a size of 30–300 μm, therefore, the upper limit of the size (t) is 300 μm or less.

In the same manner as in the first embodiment, this semiconductor device packing substrate comprises a multilayer substrate wherein a first ceramic layer 1 made of a glass ceramic, a wiring layer 2 made of copper and a second ceramic layer 3 made of a glass ceramic are provided. In this multilayer substrate, a portion of the second ceramic layer 3 is removed off to form the cavity 4. However, the side wall of the cavity 4, which is different from that in the first embodiment, has a taper 10 so that the cavity 4 spreads toward its opening. In the present embodiment, therefore, the semiconductor device 6 can be inserted inside the cavity 4 more easily than in the first embodiment.

The process for producing this semiconductor device packing substrate, and the process for producing a semiconductor device using this substrate, are substantially the same as in the first embodiment, and the explanation thereof is omitted.

(Third Embodiment)

Figure 6A:
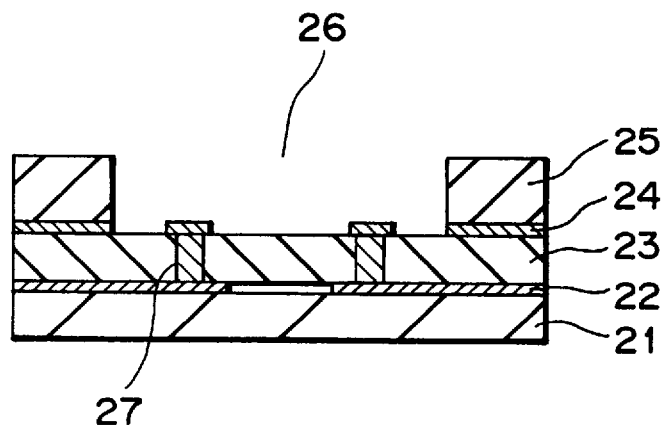
FIGS. 6A to 6C are cross-sectional views showing a process for manufacturing a semiconductor device packing substrate according to the third embodiment of the invention.
Figure 6B:
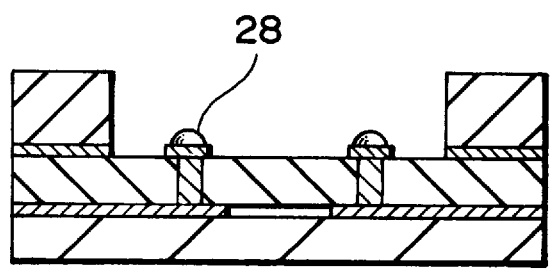
Figure 6C:
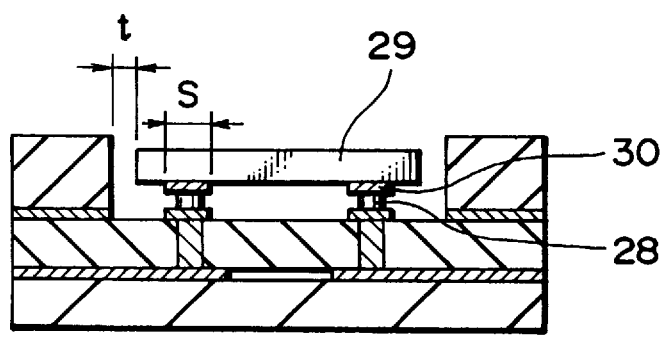

FIGS. 6A to 6C are cross-sectional views showing a process for manufacturing a semiconductor device packing substrate according to the third embodiment of the invention.

As shown in FIG. 6A, the semiconductor device packing substrate of the present embodiment is a multilayer substrate wherein provided are a first ceramic layer 21, a wiring layer 22, a second ceramic layer 23, an electrode pad layer 24 and a third ceramic layer 25. In this multilayer substrate, a portion of the third ceramic layer 25 is removed off to expose the electrode pad layer 24. Thus, a cavity 26 inside which a semiconductor device is to be inserted is formed. The electrode pad layer 24 inside the cavity 26 is patterned into a form of islands as electrode pads to which bumps 28 are connected. The electrode pads are electrically connected to the wiring layer 22 via through holes 27.

Then, as shown in FIG. 6B, the bumps 28 are provided on the electrode pads. The bumps 28 are melted at a specific temperature.

A cross section of the semiconductor device packing substrate on which the semiconductor device is packed is shown in FIG. 6C. As shown in this figure, the characteristic of the semiconductor device packing substrate in the present embodiment is that the size of the cavity 26 is larger by a given size (t) than the size of the external form of the semiconductor device 29, and the size (t) is smaller than the size (s) of the electrode pad 30 formed on the semiconductor device 29 (t<s). In the same manner as in the second embodiment, the side wall of the cavity 26 may be tapered to spread toward the opening of the cavity 26.

The following will describe the process for producing the semiconductor device packing substrate in this embodiment. As shown in FIG. 6A, provided are the first ceramic layer 21 made of a glass ceramic, the wiring layer 22 made of copper, the second ceramic layer 23 made of a glass ceramic, the electrode 24 and the third ceramic layer 25. A portion of the third ceramic layer 25 is selectively removed off to form the cavity 26 which is a space inside which the semiconductor device is embedded. The third ceramic layer 25 wherein a portion is removed off beforehand may be provided on the electrode pad layer 24 to form the cavity 26. Subsequently, the multilayer is sintered so that the first ceramic layer 21, the wiring layer 22, the second ceramic layer 23, the electrode pad 24 and the third ceramic layer 25 are united. After sintering, the bumps 28 are formed on the electrode pads 24 in the form of islands by using, for example, AuSn or the like. The size of the cavity 26 is larger by the size (t) than that of the external form of the semiconductor device 29 to be packed, and the size (t) is smaller than that of the electrode pad 30 formed on the semiconductor device 29. The electrode pad 30 formed on the semiconductor device 29 generally has a size of 30–300 μm, therefore, the upper limit of the size (t) is 300 μm or less.

Figure 7A:
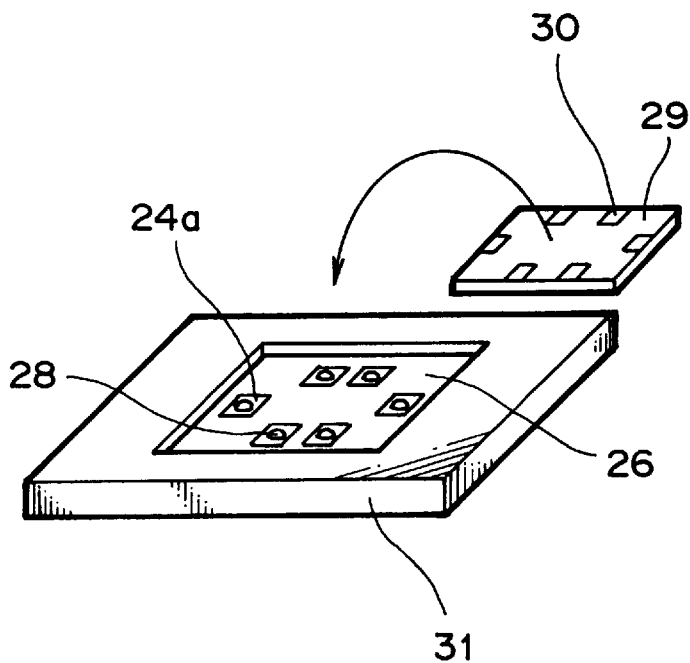
FIGS. 7A and 7B are perspective views showing a process for packing a semiconductor device in the semiconductor device packing substrate according to the third embodiment of the invention.
Figure 7B:
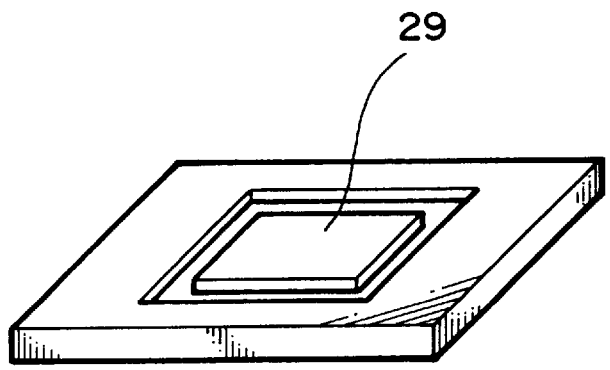

The following will further describe a process for packing a semiconductor device in this semiconductor device packing substrate. FIGS. 7A and 7B are perspective views showing a process for packing a semiconductor device in the semiconductor device packing substrate. The semiconductor device 29 is inserted inside the cavity 26 in the semiconductor device packing substrate 31 so that the cavity 26 can receive the electrode pads 30 formed on the semiconductor device 29 such as a semiconductor integrated circuit having, for example, a GaAs substrate. At this time, the side wall of the cavity 26 functions as a guide, so that the semiconductor device 29 is put on a packing position, with a tolerance within the size (s) of the electrode pad on the basis of the aforementioned requirement of t<s. This step can be carried out at room temperature without using especially precise position-aligning apparatus. Thus, the contact of the electrode pad 30 with the bump 28 is realized. The bumps 28 are made from, for example, AuSn by a punching process. The bumps 28 are melted by putting the semiconductor device packing substrate 31 on a plate (not shown) heated to, for example, 300° C. If necessary, vibration or a sound wave may be applied thereto to promote the melting of the bumps 28. The semiconductor device 29 moves to the right packing position by surface tension of the melted bump 28, so that it can be arranged at the right packing position precisely. After heating, the electrode pad 30 formed on the semiconductor device 29 is connected through the bump 28 to the electrode pad 30 in the form of islands which is made conductive by means of the wiring layer 22 and the through hole 27.

In the embodiment shown in FIGS. 7A and 7B, the electrode pads 30 are isolated from each other. Thus, even if the material for the bumps is melted, the material does not flow into other areas than the electrode pads 32. Therefore, the height of the bumps can be controlled more satisfactorily than in the first embodiment. In other words, in the first embodiment shown in FIGS. 4A and 4B, the wiring 8 is composed of the area which is connected to the bump and the pulling-out portion which continues to the inner wiring, therefore, the melted bump material may flow into the pulling-out portion. At this time, the control of the bump height may result in failure, when specific bump height is required.

In the description of the first, second, and third embodiments, the single cavity is conventionally disposed in the single semiconductor device packing substrate. However, plural cavities may be actually disposed and plural semiconductor devices may be packed inside them. In this case, the plural semiconductor devices can be packed (thermo melting bonded) together by heat treatment one time. Thus, it is possible to shorten working time and restrain deterioration of various properties of semiconductor devices which do not have high heat-resistance. If plural semiconductor devices are mounted on the same substrate and then the resultant device is divided into individual semiconductor devices, the semiconductor devices various properties of which will not be deteriorated can be mass-produced efficiently.

The numbers of the ceramic layers and the wiring layers are not limited to those specified in the aforementioned embodiments, and larger numbers may be used. An earthing layer may be used for example. Furthermore, the cavity inside which a semiconductor device can be packed is covered with a cover to attain hermetic seal, or is covered with a conductive material to be electrically shielded.

As a material for the substrate, a glass ceramic is mentioned, but other materials, such as alumina, may be used. As a material for the bump, other materials than AuSn may be used, such as AuSi and a solder. Similarly, the material of the wiring layer is not limited to those described above.

In all the aforementioned embodiments, the semiconductor device packing substrate can be widely applied to active elements such as a transistor, and passive elements.

As described above, the present invention makes it possible to provide a semiconductor device packing substrate for which an expensive and highly precise position-aligning apparatus is not necessary and in which a resin which degrades a high frequency property is not used and a semiconductor device is connected to a wiring layer with a bump which has a small inductor component, and a semiconductor device using this semiconductor device packing substrate. Plural semiconductor devices can be also packed in the same substrate at the same time. Thus, it is possible to shorten working time and restrain deterioration of various properties even in a semiconductor device having low heat-resistance.

What is claimed is:

1. A semiconductor device packing substrate wherein a semiconductor device having an electrode pad is packed, comprising:

a first insulator layer;

a wiring layer for transmitting at least a high frequency signal, provided on said first insulator layer and patterned in the wiring pattern;

a second insulator layer provided on said first insulator layer with said wiring layer, therebetween, said second insulator layer having a cavity inside which the semiconductor device is embedded, the size of the cavity being larger by a predetermined size than the size of the semiconductor device, and the upper limit of said predetermined size being the size of the electrode pad disposed on the semiconductor device; and a bump which is disposed inside the cavity for connecting said wiring layer to the semiconductor device.

2. The semiconductor device packing substrate according to claim 1, wherein the upper limit of said predetermined size is 300 $\mu$m.

3. The semiconductor device packing substrate according to claim 1, wherein the side wall of the cavity formed by said second insulator layer is tapered so that the cavity spreads toward its opening direction.

4. The semiconductor device packing substrate according to claim 1, wherein a plurality of the cavities inside which semiconductor devices are embedded are formed in the single substrate.

5. The semiconductor device packing substrate according to claim 1, wherein said first and said second insulator layers are ceramic layers.

6. A process for packing a semiconductor device in said semiconductor device packing substrate, comprising:

inserting a semiconductor device inside a cavity in said semiconductor device packing substrate, said semiconductor device including an electrode pad disposed thereon: and connecting a wiring layer to the electrode pad through a bump disposed inside the cavity for connecting said wiring layer to the semiconductor device by heating.

wherein the semiconductor device packing substrate has a plurality of said cavities and a plurality of the semiconductor devices are mounted on said plurality of cavities.

7. The process for packing a semiconductor device according to claim 6, further comprising:

dividing the packing substrate into individual semiconductor devices, after the electrode pad is connected.

8. A process for packing a semiconductor device in said semiconductor device packing substrate, comprising:

inserting a semiconductor device inside a cavity in said semiconductor device packing substrate, said semiconductor device including an electrode pad disposed thereon: and connecting a wiring layer to the electrode pad through a bump disposed inside the cavity for connecting said wiring layer to the semiconductor device by heating.

wherein a size of the cavity is larger, by a predetermined size, than a size of the semiconductor device, and wherein the upper limit of the predetermined size is 300 $\mu$m.

9. The process, according to claim 6, wherein said plurality of cavities inside which respective semiconductor devices are embedded are formed on a single substrate.

10. A process for packing a semiconductor device in said semiconductor device packing substrate, comprising:

forming a first insulator layer;

forming a wiring layer on said first insulator layer and patterning the wiring layer into a wiring pattern;

forming a second insulator layer on said first insulator layer;

removing a portion of said second insulator layer to form at least one cavity;

inserting the semiconductor device inside said at least one cavity in the semiconductor device packing substrate;

forming a bump which is disposed inside said at least one cavity for connecting said wiring layer to the semiconductor device;

connecting the wiring layer to an electrode pad disposed on the semiconductor device through the bump by heating;

providing a plurality of semiconductor devices on said substrate; and dividing the packing substrate into individual semiconductor devices, after the electrode pad is connected.

11. A process for packing a semiconductor device in said semiconductor device packing substrate, comprising:

forming a first insulator layer;

forming a wiring layer on said first insulator layer and patterning the wiring layer into a wiring pattern;

forming a second insulator layer on said first insulator layer;

removing a portion of said second insulator layer to form at least one cavity;

inserting the semiconductor device inside said at least one cavity in the semiconductor device packing substrate;

wherein the size of said at least one cavity is larger by a predetermined size than the size of the semiconductor device, and the upper limit of said predetermined size is the size of an electrode pad disposed on the semiconductor device.

12. The process for packing a semiconductor device according to claim 11, wherein the upper limit of the predetermined size is 300 $\mu$m.

* * * * *